United States Patent [19]
Iijima et al.

[11] Patent Number: 5,242,642
[45] Date of Patent: Sep. 7, 1993

[54] METHOD OF MANUFACTURING A SWITCH SUBSTRATE

[75] Inventors: Shunichi Iijima; Masanori Takemura, both of Suwa, Japan

[73] Assignee: Seiko Epson Corporation, Tokyo, Japan

[21] Appl. No.: 799,654

[22] Filed: Nov. 29, 1991

Related U.S. Application Data

[62] Division of Ser. No. 618,032, Nov. 26, 1990, Pat. No. 5,155,306.

[30] Foreign Application Priority Data

Nov. 25, 1989 [JP] Japan .................................. 1-305242
May 21, 1990 [JP] Japan .................................. 2-130788

[51] Int. Cl.⁵ ........................ B29C 39/04; B29C 69/02
[52] U.S. Cl. .................................. 264/104; 264/250; 264/272.11; 264/272.15; 264/275
[58] Field of Search ............. 264/104, 272.21, 272.11, 264/275, 272.15, 250

[56] References Cited

FOREIGN PATENT DOCUMENTS 63-136429 of 1988 Japan .
63-1386 2/1988 Japan .
2-5957 2/1990 Japan .

Primary Examiner—Jan H. Silbaugh
Assistant Examiner—Angela Ortiz
Attorney, Agent, or Firm—Kaplan Blum

[57] ABSTRACT

A switch substrate for a switching device that includes an electrical contact brush, the substrate formed with alternating conductive and insulating portions on its surface and having a groove formed between the conductive and insulating portions to eliminate insulating abrasion powder from the surface of the contact brush. The top of the conducting portions is higher than the bottom of the groove but can be above or below the surface of the insulating portions. To form such a substrate, a conductive layer having projections is formed and is engaged with a mold so that the projections are compressed. After the substrate is removed from the mold, the compressed projections extend to their actual height.

6 Claims, 7 Drawing Sheets

METHOD OF MANUFACTURING A SWITCH SUBSTRATE

This is a division of application Ser. No. 07/618,032, filed Nov. 26, 1990, now U.S. Pat. No. 5,155,306.

BACKGROUND OF THE INVENTION

The invention relates generally to a switch substrate and a method for manufacturing the substrate and more particularly to a switch substrate for a contract type switching mechanism for detecting the rotation and position of a counter, such as for detecting the position of a character in a printer.

Several types of switch substrates have been proposed which include a substrate having alternating conducting and insulating portions and a contact brush that passes over the alternating portions in a contact path to detect rotation of the substrate. One such conventional switch substrate 120 is shown in FIG. 5. Substrate 120 is formed with an electrically conductive portion 20 having a plurality of electrically conductive contact positions 25 disposed on a substrate 26 in a contact path in a clock-like fashion. A plurality of insulating contact portions 30 are disposed between contact positions 25. Examples of conventional switch substrates include switch substrates in which the electrically conductive portion is formed of a metal sheet and the insulating portion is formed of insulating synthetic resin. Other conventional switch substrates include an electrically conductive portion that is formed of conductive resin and the insulating portion is formed of insulating synthetic resin.

Three embodiments of a conventional switch substrate 61, 62 and 63 are shown in FIGS. 6, 7 and 8, respectively. Throughout the application, similar elements are assigned the same reference numerals. Switch substrate 61 is formed with an insulating resin layer 8 disposed on a conductive resin layer 7. An electrical contact portion or conductive pattern 2 of conductive resin layer 7 protrudes through the surface of insulating layer 8 and can be contacted by an electrical contact brush 4. Switch substrate 62 is similar to substrate 61, except that a continuity pattern 2' is below the level of insulating contact portion 3 of insulating layer 8. A conductive or continuity pattern 2" of substrate 63 is above the level of insulating contact portion 3 of insulating layer 8.

The conventional switch substrates have several disadvantages. When the switch substrate rotates, portions are worn by friction between the switch substrate and the contact brush. This leads to the accumulation of abrasion powder on the contact brush. The abrasion powder is typically composed mainly of insulating synthetic resin and interferes with electrical contact between the contact brush and the conductive portions. This can lead to problems such as chattering.

In FIG. 6, continuity pattern 2 and insulating contact portion 3 are on the same level. Contact brush 4 is electrically coupled to continuity pattern 2 within the region designated by a double arrow D1 (continuity region). Conductive pattern 2 has a width of a double arrow E which is as wide as D1. It is desirable to make the width of D1 as small as possible to detect small displacements and to detect the greatest number of positions. However, when continuity pattern 2 is formed of conductive resin, the width of continuity pattern 2 cannot be decreased past a practical limit since there is a minimum size filling limit when resin is molded into a conventional metal mold. When continuity pattern 2 is formed of a metal sheet, there is also a practical minimum size limit in forming continuity pattern 2.

FIG. 7 illustrates a switch with a continuity pattern 2' lower than the surface of insulating contact portion 3. Accordingly, the width of continuity region D2 is shorter than width E of continuity pattern 2'. D2 is narrower than D1. Insulating abrasion powder tends to become accumulated over continuity pattern 2' in the depression in the insulation portion 3 thereby leading to continuity failure.

Referring to FIG. 8, continuity pattern 2" protrudes above insulating contact portion 3. This assists in eliminating insulating abrasion powder from contact brush 4 to decrease continuity failure. However, raised pattern 2" causes the width or a continuity region D3 to increase to a width wider than width E of raised continuity pattern 2". It thereby becomes difficult to detect microdisplacements and to detect a plurality of positions.

Conventional switch substrate manufacturing methods also have drawbacks. An electrical continuity portion is formed and positioned in a metallic mold. The insulating portion of the substrate is then molded thereon. A gap tends to occur between the protruding continuity pattern and the metallic mold when the dimensional accuracy and the positioning accuracy are not sufficiently precise. For that reason, the surface of the continuity pattern can become covered by insulating resin. This leads to product defects.

Accordingly, it is desirable to develop an improved switch substrate and method of manufacture which avoids the shortcomings of the prior art.

SUMMARY OF THE INVENTION

Generally speaking, in accordance with the invention, a switch substrate and method of manufacture in which the substrate permits detection of micro-displacements by a contact brush which follows a path along the substrate and decreases electrical contact failure caused by accumulated insulating powder between the substrate and the brush are provided. The substrate is formed with an insulating layer having an electrically conductive pattern protruding at the surface of the insulating layer. A groove is formed in the insulating layer surface adjacent to at least one side of the conductive pattern, preferably before the conductive pattern in the path followed by the brush, so that the pattern protrudes above the bottom of the groove. The conductive pattern can be below the surface of the non-grooved portion of the insulating layer. During manufacture, a conductive resin portion having an electrical continuity pattern is engaged with a mold which compresses the continuity pattern. The insulating portions are then filled while the continuity pattern is under a state of compression. After the substrate is released from the mold, the protruding portions increase in height due to its resiliency.

Accordingly, it is an object of the invention to provide an improved switch substrate and method of formation.

Another object of the invention is to provide an improved switch substrate which eliminates problems caused by insulating abrasion powder.

A further object of the invention is to provide a switch substrate having a high number of detectable positions which can lead to detection of micro-displacements.

Still another object of the invention is to provide an improved method of forming a switch substrate in which insulating material is not inadvertently formed over the continuity pattern.

Still other objects and advantages of the invention will in part be obvious and will in part be apparent from the specification and drawings.

The invention accordingly comprises the several steps and the relation of one or more of such steps with respect to each of the others, and the article possessing the features, properties, and the relation of elements, which are exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
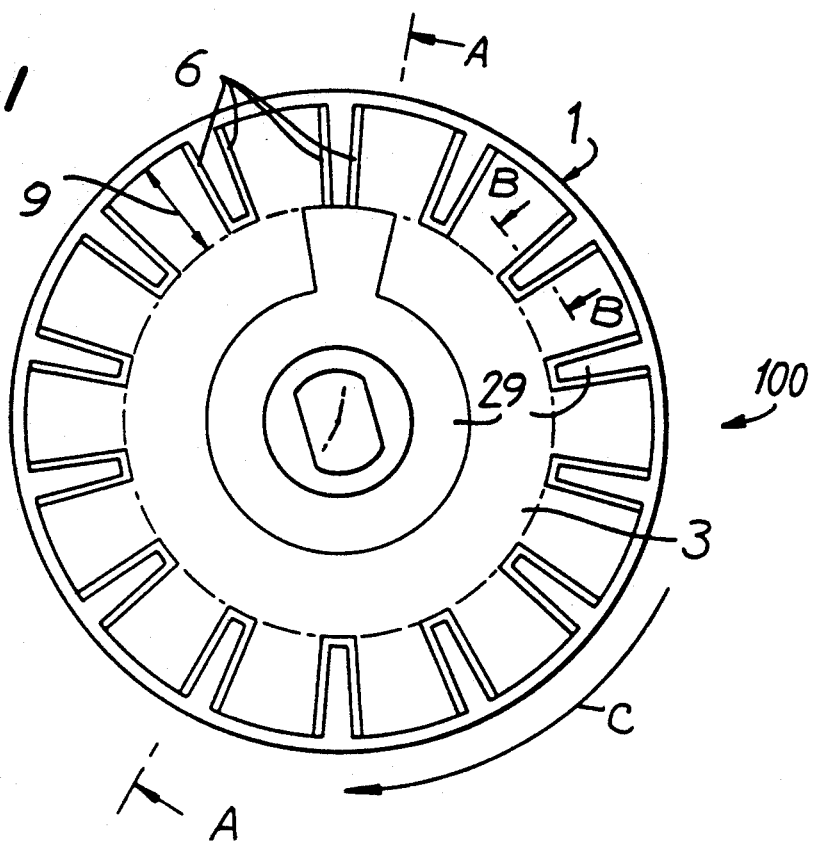
FIG. 1 is a plan view of a switch substrate constructed in accordance with the invention.
Figure 5:
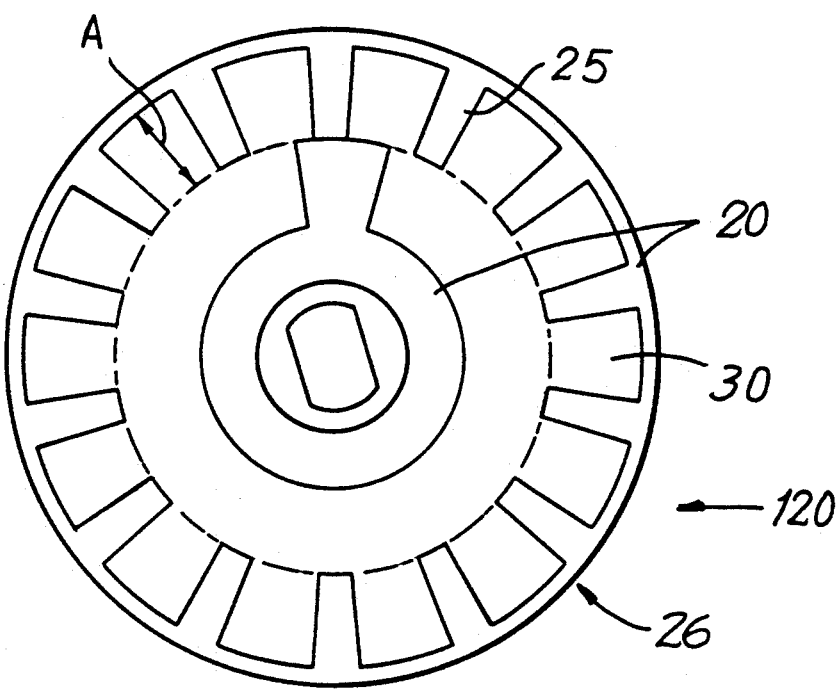
FIG. 5 is a plan view of a conventional switch substrate.
Figure 2:
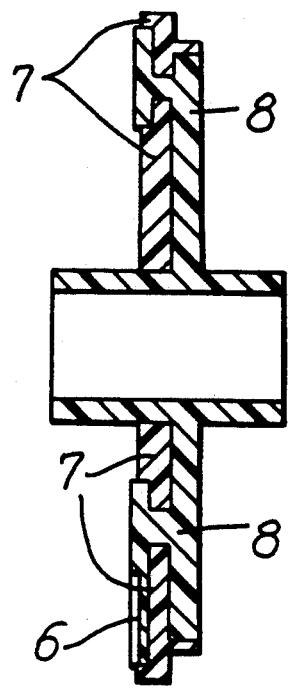
FIG. 2 is a cross-sectional view of the switch substrate shown in FIG. 1 taken along line A—A.
Figure 3:
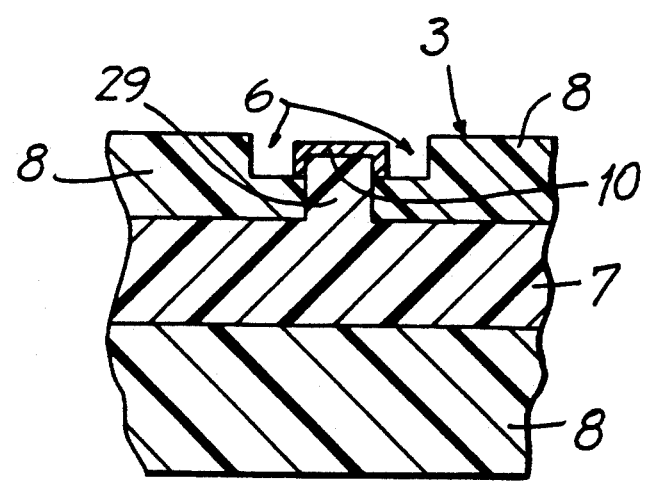
FIG. 3 is a partial cross-sectional view of the switch substrate shown in FIG. 1 taken along line B—B.

FIG. 1 is a plan view of a switch substrate 100 constructed in accordance with the invention. FIG. 2 is a sectional view taken along line A—A of FIG. 1 and FIG. 3 is a partial sectional view taken along line B—B of FIG. 1. Switch substrate 100 includes an electrically conductive resin layer 7 disposed on an electrically insulating resin substrate 8. An electrically conductive pattern 29 of conductive layer 7 is present between exposed insulating contact portions 3 of insulating layer 8. Continuity pattern 29 is covered with a metal plating 10.

The surface of continuity pattern 29 and plating 10 is below the surface of insulating contact portion 3. A groove 6 is provided at the boundary between continuity pattern 29 and insulating contact portion 3 in a region on which an electrical contact brush passes. The bottom surface of groove 6 is below the top of continuity pattern 29.

Figure 4A:
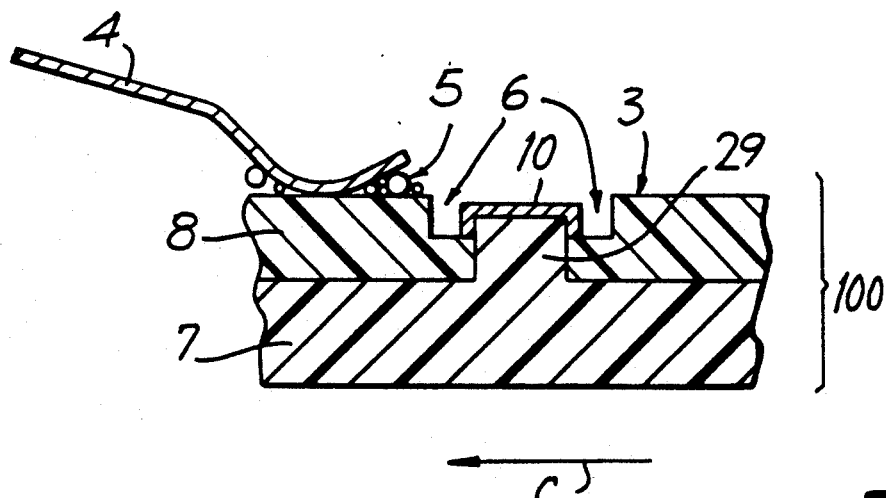
FIGS. 4A, 4B and 4C are partial cross-sectional views or the switch substrate of FIG. 1 in use, at sequential moments or time.
Figure 4B:
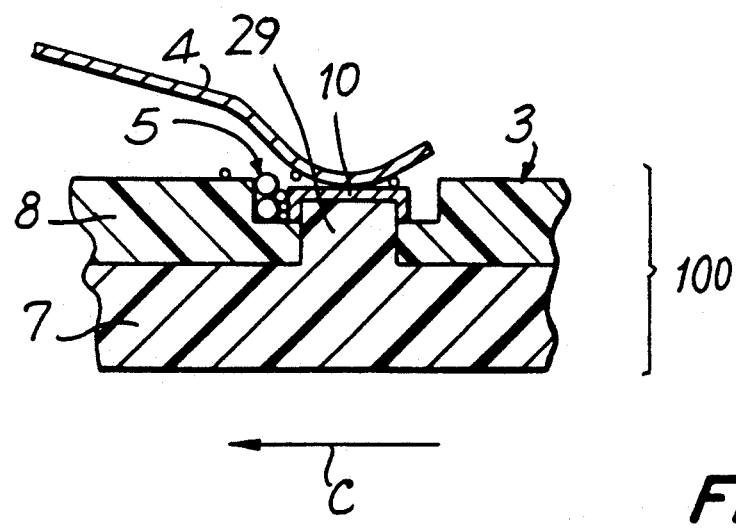
Figure 4C:
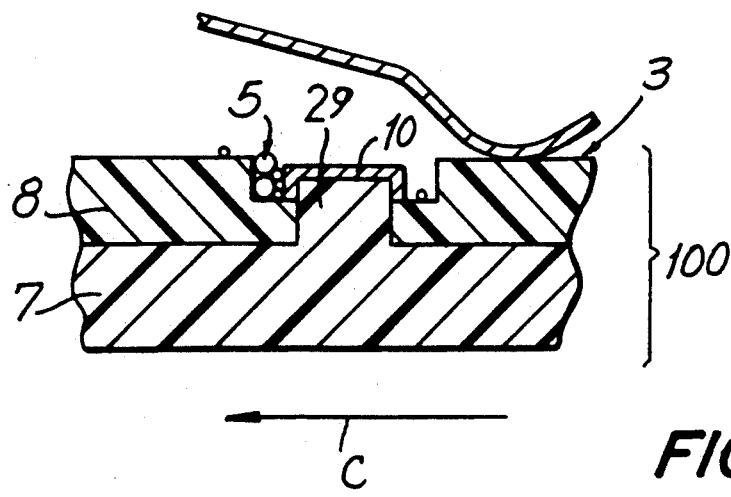

FIGS. 4A, 4B and 4C are partial sectional views of switch substrate 100, in use. As switch 100 is rotated in the direction of an arrow C, continuity pattern 29 passes by a contact brush 4 which follows a contact path over continuity pattern 29 and insulating contact portions 3. A quantity of abrasion powder 5 collects at brush 4. FIG. 4A illustrates the state in which contact brush 4 has not yet contacted continuity pattern 29. FIG. 4B shows that when switch substrate 100 rotates further, contact brush 4 causes abrasion powder 5 to drop into groove 6 and the conductive surface of contact brush 4 is exposed and is free to come into contact with continuity pattern 29. FIG. 4C shows the position of the elements after contact brush 4 has separated from continuity pattern 29.

Accordingly, switching is conducted in this manner and the chance of continuity failure caused by abrasion powder 5 is significantly decreased or eliminated. The cleaning function of groove 6 eliminates the necessity of raising continuity pattern 29 above the level of insulating contact portion 3 in order to remove abrasive powder. However, the level of pattern 29 can be set at any selected height, either above or below the surface of insulating contact portions so long as groove 6 is present. Lowering the height of continuity pattern 29 permits a more narrow continuity section.

Figure 12:
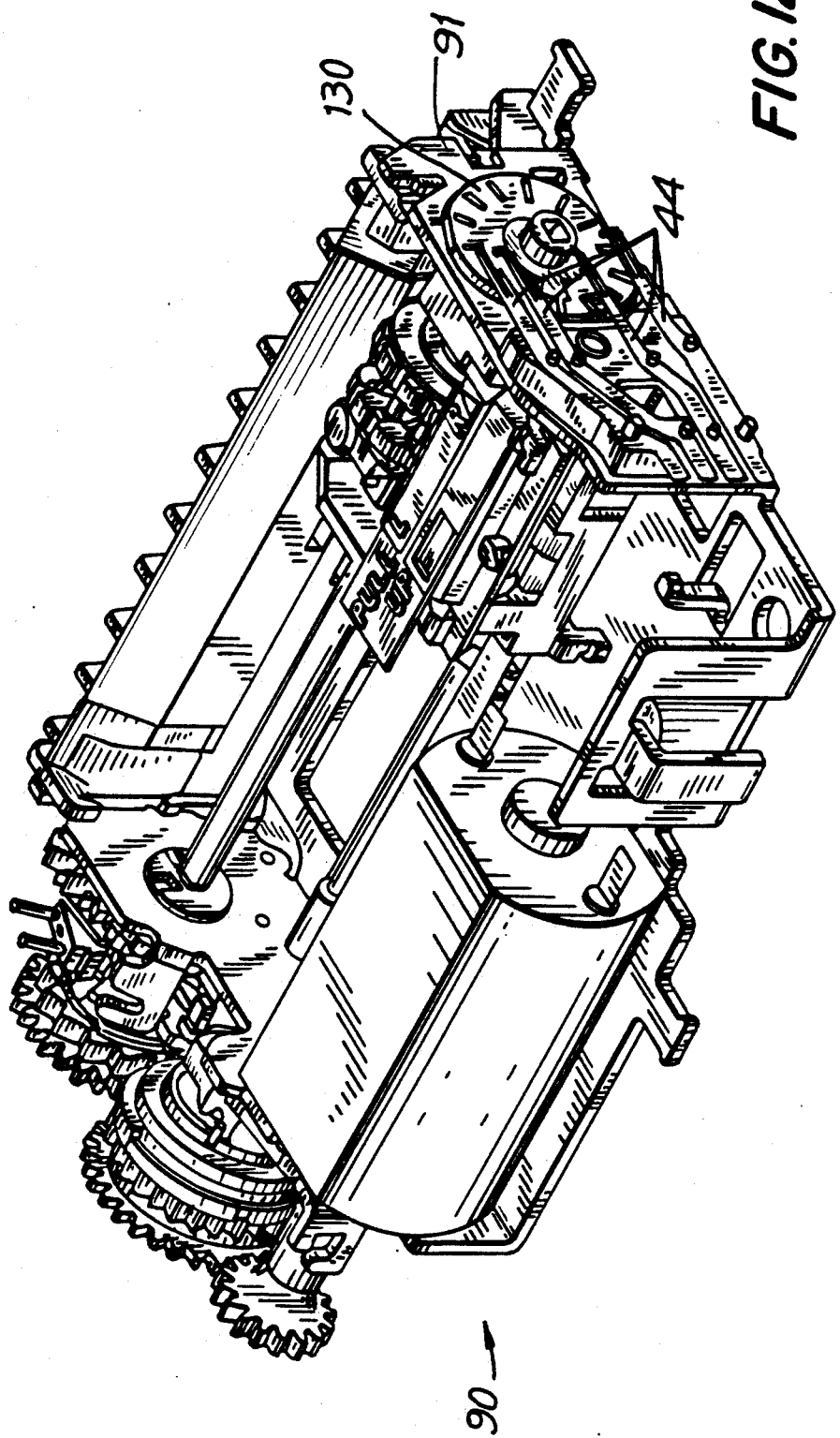
FIG. 12 is a perspective view of a printer including a switch substrate constructed in accordance with the invention.

FIG. 12 shows a printer mechanism 90 including a switch substrate 130 mounted on a frame member 91, constructed in accordance with the invention. Printer 90 also includes a plurality of electrical contact brushes 44 for detecting the position and micro-displacement of switch substrate 130.

EXAMPLE 1

Figure 6:
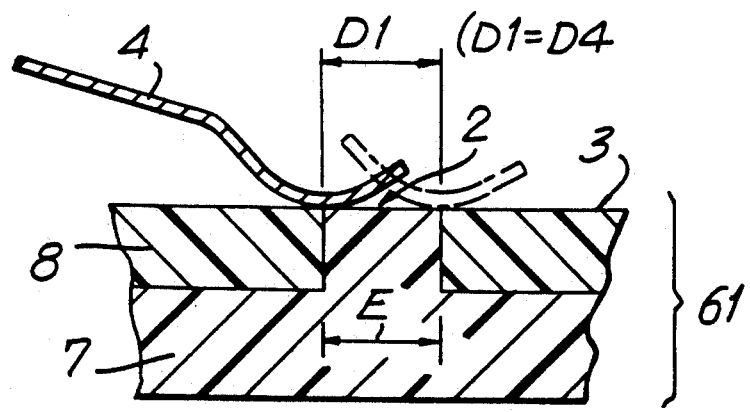
FIGS. 6, 7 and 8 are partial cross-sectional views of switch substrates constructed in accordance with the prior art in use.
Figure 7:
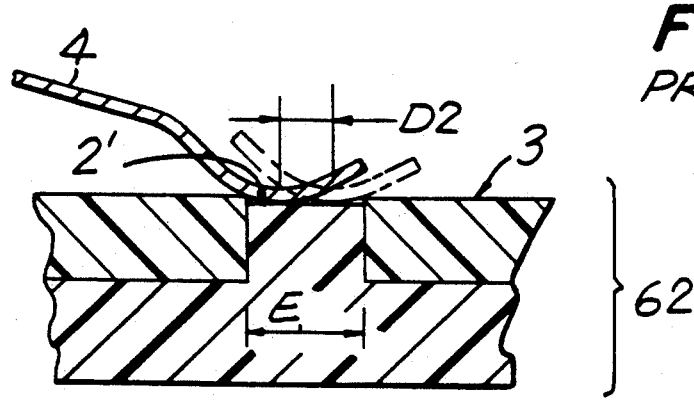
Figure 8:
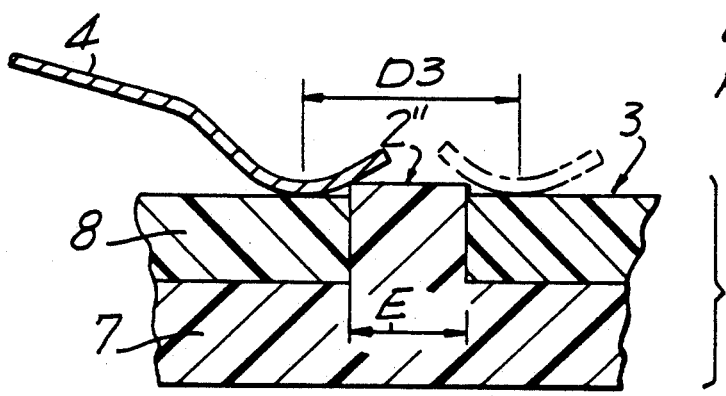
Figure 9:
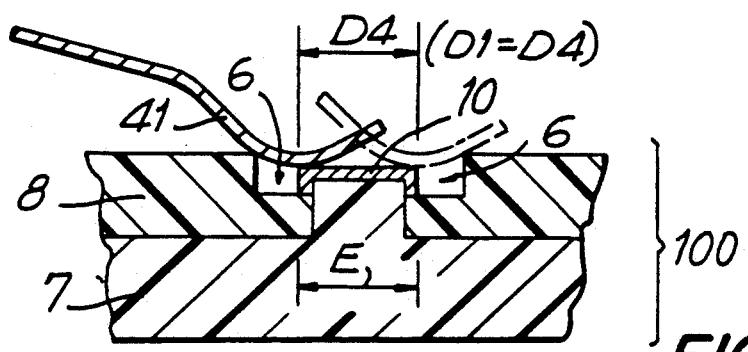
FIG. 9 is a partial cross-sectional view of a switch substrate of FIG. 1, in use.

FIG. 9 is a partial sectional view of a switch substrate 100 constructed in accordance with the invention. The outer radius of curvature of a tip portion 41 of contact brush 4 was 0.4 mm. The width of continuity pattern 29 was 0.56 mm and the surface of continuity pattern 29 was 60 $\mu$m lower than the surface of insulating contact portion 3. The bottom of groove 6 was 0.14 mm lower than the surface of continuity pattern 29 and groove 6 was 0.271 mm wide. The width of a continuity section corresponding to the positions in which contact brush 4 is electrically coupled to continuity pattern 29 is represented by a double arrow D4. Width D1 of continuity pattern 2 of substrate 61 of FIG. 6 is equal to width D4 of FIG. 9. However, the chance of continuity failure caused by abrasion powder and the like are significantly smaller for substrate 100.

The width of groove 6 and the relationship between the height of the surface of continuity pattern 29 and that of insulating contact portion 3 are merely exemplary and the desired width of the continuity section can be obtained by adjusting each value. For example width D4 can be decreased to be narrower than D1 by narrowing groove 6 or by lowering the surface of continuity pattern 29. Width D4 can be made substantially narrower than D3 despite having the same width of continuity pattern. Accordingly, the chances of continuity failure in substrate 100 are few and microdisplacements that are smaller than in similarly dimensioned conventional switch substrates can be detected.

The width of the groove and the difference of height between the surface of the continuity pattern and the surface of the insulating contact portion should preferably come within the following ranges: the groove should be more than 1 mm wide; the difference of height between the surface of the continuity pattern and the surface of the insulating contact portion should not be more than 100 $\mu$m; and the difference of height between the surface of the continuity pattern and the bottom of the groove should not be less than 5 $\mu$m.

The conductive portion of substrate 100 of Example 1 was formed from conductive resin having metal plating 10 on continuity pattern 29. However, metal plating is not always necessary. Furthermore, the continuity pattern can be formed of metal on an insulating substrate and accordingly, conductive resin is not necessary.

EXAMPLE 2

Figure 10:
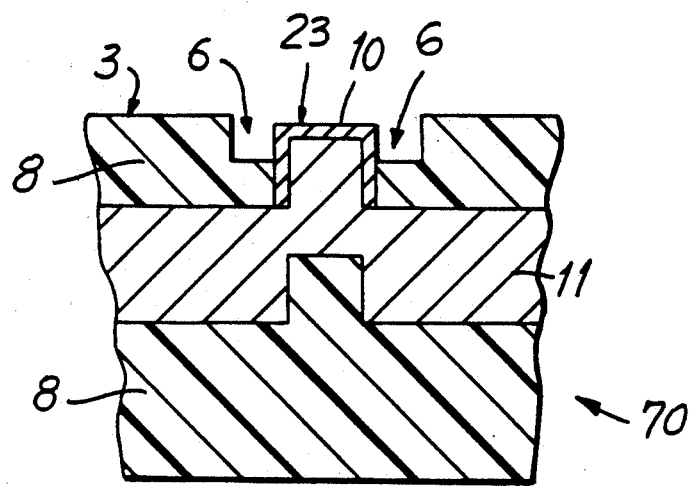
FIG. 10 is a partial sectional view of a switch substrate constructed in accordance with another embodiment of the invention.
Figure 11:
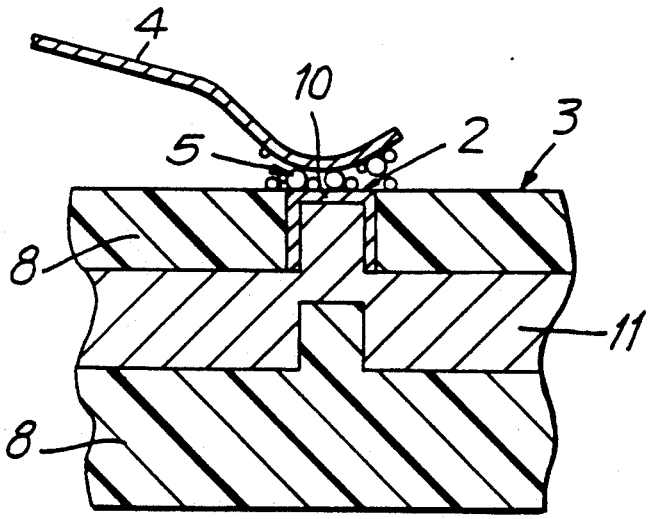
FIG. 11 is a partial cross-sectional view of a prior art switch substrate, in use.

FIG. 10 illustrates a switch substrate 70 constructed in accordance with another embodiment of the invention in which the conductive portion of substrate 70 includes a metal sheet 11 having metal plating 10 thereon. FIG. 11 shows a prior art substrate 80 including metal sheet 11, in use. Groove 6 is provided next to a continuity pattern 23 of substrate 70, which is lower than the surface of insulating contact portion 3. The switching process and the width of the continuity portion were the same as those of Example 1. Accordingly, the chance of continuity failure was small and microdisplacements which are smaller than those of conventional substrates can be detected.

The following drawbacks can occur when conventional manufacturing methods are employed to form switching substrate 70 in which continuity pattern 23 includes a metal sheet and a groove is provided next to continuity pattern 23. After the conductive portion is formed, a formed metal sheet is set and positioned in a metallic mold for use in forming the insulating portion of the substrate. To form groove 6, the shape of the metallic mold for use in forming the insulating portion is complicated because a plurality of cut-out portions must be provided downward on the metallic mold for use in forming the insulating contact portions. The number of cut-out portions is the same as the number of continuity patterns (conductive contact portions). The cut-out portions and the protruding portions of the conductive portion of the substrate must be closely aligned so that the insulating resin can be formed properly.

Gaps can occur between the conductive portion and the mold when the dimensions of the metallic mold are not sufficiently accurate and the setting of the conductive portion to the metallic mold is not adequate. This leads to failure of engagement between the cut-out portions of the metallic mold and the protruding portions of the continuity pattern. Consequently, insulating resin can cover the surface of the continuity portion as shown in FIG. 10.

Figure 13:
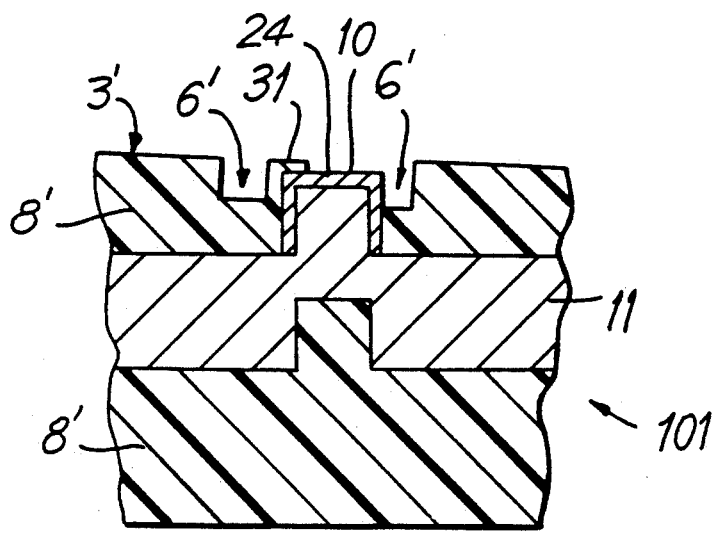
FIG. 13 is partial sectional view of a switch substrate constructed in accordance with a conventional method.

FIG. 13 is a partial sectional view of a switch substrate 101 which is formed in a conventional manner as follows. A metallic mold for use in forming the insulating portion is unintentionally set to the left with regard to metallic sheet 11. An insulating contact portion 3 is formed at an angle with respect to the surface of a continuity pattern 24 so that the surface of continuity pattern 24 is unintentionally partially covered by a finger 31 of insulating contact portion 3'.

Figure 14A:
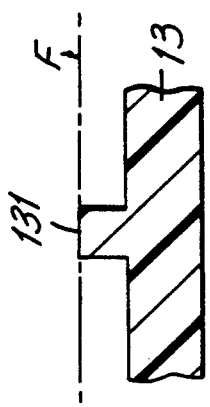
FIGS. 14A, 14B and 14C are partial cross-sectional views illustrating steps for forming a switch substrate in accordance with the invention.
Figure 14B:
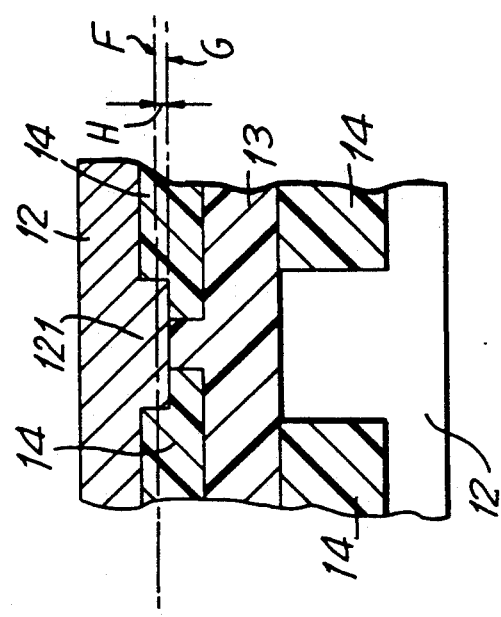
Figure 14C:
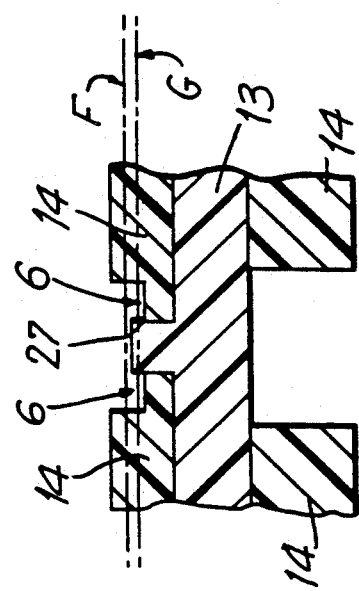

Steps for forming a switching substrate 110 in accordance with the invention are illustrated in FIGS. 14A, 14B and 14C. FIG. 14A illustrates electrically conductive synthetic resin member 13 which will form the electrical continuity portion of substrate 110. As shown in FIG. 14B, conductive resin member 13 is fitted to a metallic mold 12 and a second insulating synthetic resin member 14 is filled in metallic mold 12 and first synthetic resin layer 13 is being compressed therebetween. Second synthetic resin member 14 forms the insulating portions between the electrical contact portions of first conductive resin layer 13. FIG. 14C illustrates completed switch substrate 110.

As illustrated in FIG. 14A, first conductive synthetic resin member 13 is formed with a protrusion 131 which will act as a continuity pattern 27 for contacting a brush. A broken line F indicates the top position of protrusion 131 in a non-compressed state. As illustrated in FIG. 14B, first synthetic resin member 13 is compressed by metallic mold 12 before forming second synthetic resin member 14. Metallic mold 12 is formed so that a projection 121 contacts protrusion 131. The area of mold projection 121 is larger than that of continuity protrusion 131. A broken line G indicates the position of the top portion of protrusion 131 when compressed. The distance between line F and line G, which is shown by a double arrow H indicates the amount of compression of first synthetic resin layer 13.

After insulating resin member 14 is formed, the compression force applied by metallic mold 12 is released and protrusion 131 is restored from line G toward line F by the resilience of the resin material. In addition to the restoration of the height of protrusion 131, second synthetic resin member 14 shrinks so that groove 6 is formed next to continuity pattern 27. In this manner switch substrate 110 having groove 6 next to continuity pattern 27 is obtained and insulating resin does not form on the continuity pattern.

EXAMPLE 3

A difference in height of 10 $\mu$m, between the surface of the continuity pattern and the bottom of the groove was obtained under conditions that: the first synthetic resin was 0.9 mm thick polyacetal; the second synthetic resin was polybutylene terephthalate and the thickness at the bottom portion of the groove was 0.4 mm; and the compression of the first synthetic resin was 30 $\mu$m. However, acceptable substrates can also be formed in which the difference of height between the surface of the continuity pattern and the bottom of the groove are varied by changing the resin material, the thickness and the degree of compression.

The electrical continuity portion is formed by first synthetic resin 13 which is compressed by metallic mold 12 for forming second synthetic resin member 14. Accordingly, when the resin material for second synthetic resin member 14 is filled, the surface of a continuity pattern 27 is not covered by the insulating resin material which forms the insulating portion of substrate 110. Further, groove 6 next to continuity pattern 27, is automatically formed by the resilience of the compressed first synthetic resin layer 13 and the shrinkage of second synthetic resin member 14. Consequently, it is not necessary to set metallic mold 12 downward, as in conventional methods, for use in forming second synthetic resin member 14 in order to form groove 6.

Metallic mold 12 can be set at first conductive synthetic resin layer 13 without the engagement of a cut-out portion and a protrusion so that a gap will not be produced between first synthetic resin layer 13 and metallic mold 12 even if the dimensional accuracy and the setting accuracy are not exactly precise. Formation defects which are caused when the surface of continuity pattern 27 is covered by portions of second synthetic resin 14 are prevented to yield a switch substrate which can detect a microdisplacement and which can be manufactured with high productivity.

When a conductive metal sheet is used, rather than conductive resin, it cannot be restored as efficiently as a synthetic resin when the compression force is released. Furthermore, a metal sheet is disadvantageous because the size of the apparatus necessary for forming the substrate increases becomes large and is heavy when the compression force is increased. The metallic mold is also worn at the contact portion with the metal sheet and the lifetime of the metallic mold is shortened.

The configurations of the invention can be applied to a switch substrate in which the continuity portion and insulating portion of which are composed of synthetic resin. However, the present invention is not limited to such specific embodiment.

In accordance with another embodiment of the invention, the electrical contact portion can protrude above the surface of the substrate. To form such a substrate, the metallic mold is formed without protrusion 121. The first conductive synthetic resin layer is compressed by a flat surface and the protruding conductive portion extends above the surface of the substrate due to its resiliency.

As described above, a switch substrate prepared in accordance with the invention is provided with a groove which is adjacent to the continuity portion so that abrasion powder which can cause contact failure does not interfere with contact point of the contact brush. The continuity portion can then come into electric contact with the contact brush. Positive continuity can be provided and the reliability of the switch mechanism can be improved. Because the surface of the continuity pattern is lower than the surface of the insulating portion, the size of the continuity section can be shortened compared with a continuity pattern of even level and a contact type switch mechanism in which microdisplacement can be detected can be provided while positive continuity is obtained. Further, a switch substrate which is characterized in that a plurality of positions can be detected by a single switch substrate can be provided.

When the switch substrate includes a first synthetic resin portion forming an electrical continuity portion and also a second synthetic resin portion forming an insulating portion and the two portions are constructed and arranged so that when the groove adjacent to the electrical continuity portion is formed by the two resins, the switch substrate has the above-described functional effects and the switch substrate can be made by the manufacturing method discussed above so that the forming apparatus can be made compact and the life of the metallic mold can be made long.

The above-described switch substrate having a groove adjacent to the electrical continuity portion can be easily manufactured as discussed above without making the shape of the metallic mold for forming the second synthetic resin complicated. Accordingly, the switch substrate manufacturing method includes forming a first synthetic resin portion to be the electrical continuity portion and forming the mold of the second insulating synthetic resin portion, compressing the first synthetic resin portion and forming the second insulating resin portion while the first synthetic resin is compressed.

This method eliminates problems associated with conventional manufacturing techniques, which lead to production defects in which the surface of the continuity pattern is covered with the second insulating synthetic resin. Furthermore, in accordance with the invention, the adhesion between the first synthetic resin and the metallic mold for use in forming the second synthetic resin has been improved and the influence caused by setting inaccuracy and dimensional inaccuracy has been eliminated, so that production defect problems have been eliminated. Accordingly, the quality and productivity of a switch substrate are greatly improved.

It will thus be seen that the objects set forth above, among those made apparent from the preceding description, are efficiently attained and, since certain changes may be made in carrying out the above method and in the article set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

Particularly it is to be understood that in said claims, ingredients or compounds recited in the singular are intended to include compatible mixtures of such ingredients wherever the sense permits.

What is claimed is:

1. A method of forming a switch substrate having a plurality of spaced conductive regions alternating with insulating regions having outer surfaces along a contact path for use with an electrical contact brush following the path, comprising:
   forming a first member of conductive resin material, with a plurality of projections having upper surfaces at ends of the projections;
   placing the first member in a metal mold so that the projections are compressed by pressing the upper surfaces of the projections so that the height of the projections is shortened;
   filling a region between the mold and the first member with insulating material to form a second insulating member on the first member with insulating material between the projections and not on the upper surfaces of the projections;
   releasing the first and second members from the mold and permitting the compressed projections to increase in height upon release, the upper surfaces of the projections remaining free of insulating material, having been in compression contact with the metal mold and forming a groove on at least one side of the projections along the path with the bottom of the groove being below the height of an outer surface of the insulating material and the upper surface of the projections.

2. The method of forming a switch substrate of claim 1, wherein the substrate is constructed of materials and under compression pressure such that a surface of the second insulating member defining the bottom of the groove decreases in height after the substrate is released from the mold.

3. The method of forming a switch substrate of claim 1, wherein the projections and the metal mold are dimensioned so that the upper surfaces of the projections have a height less than the height of the outer surface of the insulating portions along the path.

4. The method of forming a switch substrate of claim 1, wherein the projections and the metal mold are dimensioned so that the upper surfaces of the projections have a height greater than the height of the outer surface of the insulating portions along the path.

5. The method of forming a switch substrate of claim 1, including plating with metal the surface of the projections extending through the insulating member.

6. The method of forming a switch substrate of claim 1, including forming a groove on both sides of the projections along the path.

* * * * *